(12) United States Patent
Heo et al.

(10) Patent No.: US 11,839,109 B2
(45) Date of Patent: Dec. 5, 2023

(54) DISPLAY APPARATUS

(71) Applicant: LG Display Co., Ltd., Seoul (KR)

(72) Inventors: Seungho Heo, Paju-si (KR); Beong-Ho Lee, Gumi-si (KR); Sangdeok Ha, Paju-si (KR); JeongGi Yun, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 203 days.

(21) Appl. No.: 17/524,645

(22) Filed: Nov. 11, 2021

(65) Prior Publication Data

US 2022/0208867 A1 Jun. 30, 2022

(30) Foreign Application Priority Data

Dec. 28, 2020 (KR) .................. 10-2020-0185235

(51) Int. Cl.
*H01L 21/00* (2006.01)
*H10K 59/121* (2023.01)
*H10K 59/35* (2023.01)
*H10K 59/122* (2023.01)

(52) U.S. Cl.
CPC ......... *H10K 59/121* (2023.02); *H10K 59/352* (2023.02); *H10K 59/122* (2023.02)

(58) Field of Classification Search
CPC ............................ H10K 59/121; H10K 59/352
See application file for complete search history.

(56) References Cited

U.S. PATENT DOCUMENTS

| 8,969,855 | B2 | 3/2015 | Kwak |
| 2013/0140589 | A1 | 6/2013 | Kwak |
| 2019/0006445 | A1* | 1/2019 | Seok ............... H10K 59/35 |
| 2021/0351248 | A1* | 11/2021 | Lee ................ H10K 59/122 |

FOREIGN PATENT DOCUMENTS

KR 10-2013-0061493 A 6/2013

* cited by examiner

*Primary Examiner* — Douglas M Menz
(74) *Attorney, Agent, or Firm* — Fenwick & West LLP

(57) ABSTRACT

According to an aspect of the present disclosure, a display apparatus includes a substrate in which a plurality of sub pixels is defined; a plurality of light emitting diodes which are disposed in the plurality of sub pixels, share a common organic layer and a cathode, and have an emission layer and an anode which are separated, respectively; a conductive layer disposed between the plurality of sub pixels; and a bank which is disposed below the cathode between the plurality of light emitting diodes and exposes the anode and the conductive layer. The plurality of sub pixels include a first sub pixel and a second sub pixel having a turn-on voltage lower than that of the first sub pixel, and the conductive layer is disposed to be closer to the second sub pixel between the first sub pixel and the second sub pixel.

26 Claims, 12 Drawing Sheets

DISPLAY APPARATUS

CROSS-REFERENCE TO RELATED APPLICATIONS

This application claims the priority of Korean Patent Application No. 10-2020-0185235 filed on Dec. 28, 2020, in the Korean Intellectual Property Office, the disclosure of which is incorporated herein by reference.

BACKGROUND

Field

The present disclosure relates to a display apparatus, and more particularly, to a display apparatus which may improve color mixture of light emitted from a plurality of light emitting diodes and minimize the degradation of the luminance of the light emitting diode.

Description of the Related Art

Currently, as it enters a full-scale information era, a field of a display apparatus which visually expresses electrical information signals has been rapidly developed and studies are continued to improve performances of various display apparatuses and make the display thinner, light weight, and power efficient.

Among various display apparatuses, an organic display apparatus is a self-emitting display apparatus so that a separate light source is not necessary, which is different from the liquid crystal display apparatus. Therefore, the light emitting display apparatus may be manufactured to be thin and have light weight. Further, since the organic display apparatus is driven at a low voltage, it is advantageous not only in terms of power consumption, but also in terms of the color implementation, the response speed, the viewing angle, and the contrast ratio CR, so that the light emitting display apparatus is being studied as next generation displays.

SUMMARY

An object to be achieved by the present disclosure is to provide a display apparatus which may minimize a leakage current when the display apparatus is driven.

Another object to be achieved by the present disclosure is to provide a display apparatus which minimizes reduction in a luminance of a sub pixel.

Objects of the present disclosure are not limited to the above-mentioned objects, and other objects, which are not mentioned above, can be clearly understood by those skilled in the art from the following descriptions.

According to an aspect of the present disclosure, a display apparatus includes a substrate in which a plurality of sub pixels is defined; a plurality of light emitting diodes which are disposed in the plurality of sub pixels, share a common organic layer and a cathode, and have an emission layer and an anode which are separated, respectively; a conductive layer disposed between the plurality of sub pixels; and a bank which is disposed below the cathode between the plurality of light emitting diodes and exposes the anode and the conductive layer. The plurality of sub pixels include a first sub pixel and a second sub pixel having a turn-on voltage lower than that of the first sub pixel, and the conductive layer is disposed to be closer to the second sub pixel between the first sub pixel and the second sub pixel.

According to another aspect of the present disclosure, a display apparatus includes a substrate, a plurality of sub pixels which are disposed on the substrate and include a first sub pixel and a second sub pixel having a turn-on voltage lower than that of the first sub pixel; a plurality of light emitting diodes which include an anode, an emission layer, a common organic layer, and a cathode and are disposed in each of the first sub pixel and the second sub pixel; and a conductive layer which is disposed to be closer to the second sub pixel between the first sub pixel. The plurality of light emitting diodes share a common organic layer and a cathode.

Other detailed matters of the exemplary embodiments are included in the detailed description and the drawings.

According to the present disclosure, a conductive layer is disposed between a plurality of sub pixels to suppress the leakage of the current through a common organic layer.

According to the present disclosure, even though the current is leaked from the sub pixel, the emission layer on the conductive layer emits light to minimize the degradation of the luminance of the sub pixel.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
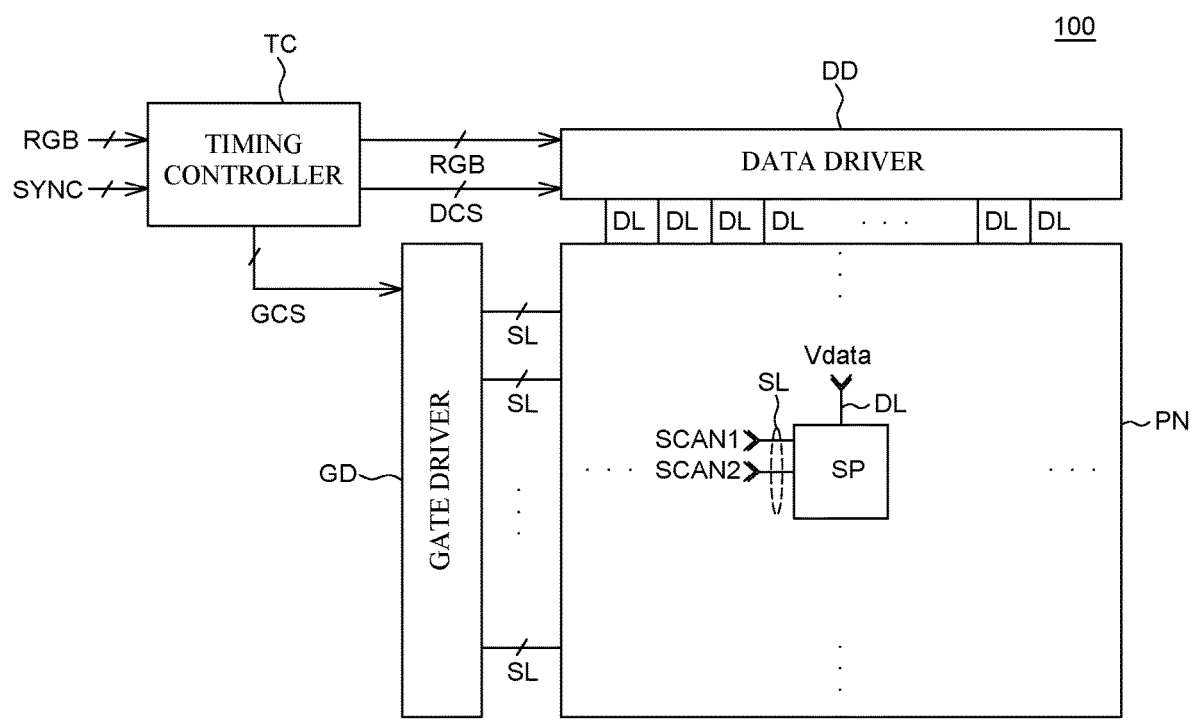
FIG. 1 is a schematic configuration diagram of a display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a stretchable display device according to exemplary embodiments of the present disclosure will be described in detail with reference to accompanying drawings.

FIG. 1 is a schematic configuration diagram of a display apparatus according to an exemplary embodiment of the present disclosure. In FIG. 1, for the convenience of description, among various components of the display apparatus 100, only a display panel PN, a gate driver GD, a data driver DD, and a timing controller TC are illustrated.

Referring to FIG. 1, the display apparatus 100 includes a display panel PN including a plurality of sub pixels SP, a gate driver GD and a data driver DD which supply various signals to the display panel PN, and a timing controller TC which controls the gate driver GD and the data driver DD.

The gate driver GD supplies a plurality of scan signals to a plurality of scan lines SL in accordance with a plurality of gate control signals GCS supplied from the timing controller TC. The plurality of scan signals may include a first scan signal SCAN1 and a second scan signal SCAN2. Even though in FIG. 1, one gate driver GD is spaced apart from one side of the display panel PD, the gate driver GD may be disposed in a gate in panel (GIP) manner and the number of gate drivers GD and the placement thereof are not limited thereto.

The data driver DD converts image data RGB input from the timing controller TC in accordance with a plurality of data control signals DCS supplied from the timing controller TC into a data signal using a reference gamma voltage. The data driver DD may supply the converted data signal to the plurality of data lines DL.

The timing controller TC aligns image data RGB input from the outside to supply the image data to the data driver DD. The timing controller TC may generate a gate control signal GCS and a data control signal DCS using synchronization signals SYNC input from the outside, such as a dot clock signal, a data enable signal, and horizontal/vertical synchronization signals. The timing controller TC supplies the generated gate control signal GCS and data control signal DCS to the gate driver GD and the data driver DD, respectively, to control the gate driver GD and the data driver DD, respectively.

The display panel PN is a configuration which displays images to the user and includes the plurality of sub pixels SP. In the display panel PN, the plurality of scan lines SL and the plurality of data lines DL intersect each other and the plurality of sub pixels SP are connected to the scan lines SL and the data lines DL, respectively. Even though not illustrated in the drawings, the plurality of sub pixels SP may be connected to a high potential power line, a low potential power line, an initialization signal line, an emission control signal line, and the like.

The plurality of sub pixels SP are a minimum unit which configures a screen and each of the plurality of sub pixels SP may include a light emitting diode and a pixel circuit for driving the light emitting diode. The plurality of light emitting diodes may be defined in different ways depending on a type of the display panel PN. For example, when the display panel PN is an organic light emitting display panel, the light emitting diode may be an organic light emitting diode which includes an anode, an organic layer, and a cathode. In addition, a quantum-dot light emitting diode QLED including quantum dots (QD), and the like may be used as the light emitting diode. Hereinafter, even though the description will be made under the assumption that the light emitting diode is the organic light emitting diode, the type of the light emitting diode is not limited thereto.

A pixel circuit is a circuit for controlling the driving of the light emitting diode. For example, the pixel circuit may be configured to include a plurality of transistors and a capacitor, but is not limited thereto.

Hereinafter, the pixel circuit of the sub pixel SP will be described in more detail with reference to FIG. 2.

Figure 2:
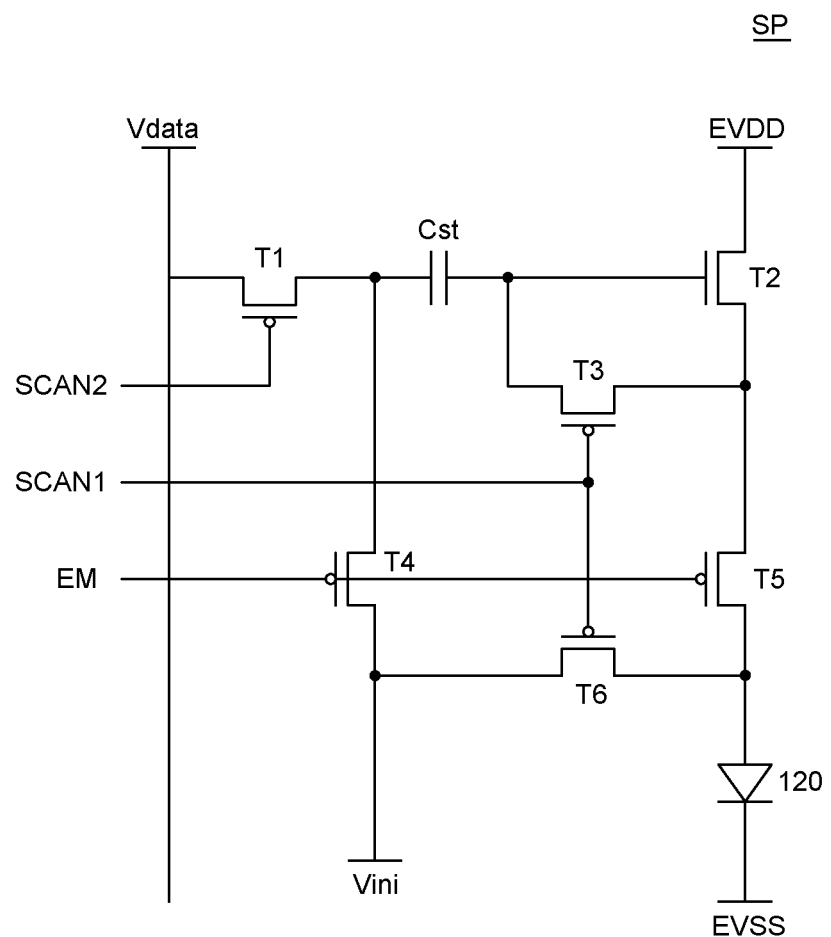
FIG. 2 is a circuit diagram of a sub pixel of a display apparatus according to an exemplary embodiment of the present disclosure.

FIG. 2 is a circuit diagram of a sub pixel of a display apparatus according to an exemplary embodiment of the present disclosure.

Referring to FIG. 2, the pixel circuit of the plurality of sub pixels SP includes first to sixth transistors T1, T2, T3, T4, T5, and T6 and a capacitor Cst.

The first transistor T1 is connected to a second scan line to be controlled by a second scan signal SCAN2 supplied through the second scan line. Further, the first transistor T1 may be electrically connected between a data line which supplies a data signal Vdata and the capacitor Cst. When a turn-on level second scan signal SCAN2 is applied to the first transistor T1 through the second scan line, the first transistor T1 transmits the data signal Vdata from the data line to the capacitor Cst.

The first transistor T1 may be referred to as a switching transistor which controls a timing at which the data signal Vdata is applied to the capacitor Cst.

The second transistor T2 may be electrically connected between the high potential power line to which a high potential power signal EVDD is supplied and the fifth transistor T5. A gate electrode of the second transistor T2 may be electrically connected to the capacitor Cst. The second transistor T2 may be referred to as a driving transistor which controls a current flowing through the light emitting diode 120 in accordance with a voltage applied to the gate electrode to control a luminance of the light emitting diode 120.

The third transistor T3 may be controlled by the first scan signal SCAN1 supplied through a first scan line. The third transistor T3 may be electrically connected between the gate electrode and a drain electrode of the second transistor T2 or between the gate electrode and the source electrode, depending on the type of the third transistor T3.

In the meantime, the second transistor T2 serving as the driving transistor needs to control the current flowing through the light emitting diode 120 in accordance with the data signal Vdata applied to the sub pixel SP. However, a luminance deviation of the light emitting diode 120 disposed in each sub pixel SP may be caused by a threshold voltage deviation of the second transistor T2 disposed in every sub pixel SP.

At this time, the third transistor T3 is disposed to compensate for the threshold voltage of the second transistor T2 so that the third transistor T3 may be referred to as a compensation transistor. For example, when the first scan signal SCAN1 which turns on the third transistor T3 is applied, a voltage obtained by subtracting the threshold voltage of the second transistor T2 from the high potential power signal EVDD is applied to the gate electrode of the second transistor T2. Further, in a state in which the high potential power signal EVDD from which the threshold voltage is subtracted is applied to the gate electrode of the second transistor T2, the data signal Vdata is applied to the capacitor Cst to compensate for the threshold voltage of the second transistor T2.

In the meantime, it is illustrated that the third transistor T3 and the first transistor T1 are applied with different scan signals SCAN1 and SCAN2 from different scan lines. However, the third transistor T3 and the first transistor T1 may be connected to the same scan line and may be applied with the same scan signals SCAN1 and SCAN2, and they are not limited thereto.

The fourth transistor T4 may be electrically connected to the capacitor Cst and the initialization signal line to which an initialization signal Vini is supplied. Further, the fourth transistor T4 may be controlled by an emission control signal EM supplied through the emission control signal line. When a turn-on level emission control signal EM is applied through the emission control signal line, the fourth transistor T4 may initialize the voltage of the capacitor Cst or slowly discharge the data signal Vdata applied to the capacitor Cst to allow the current in accordance with the data signal Vdata to flow through the light emitting diode 120.

The fifth transistor T5 is electrically connected between the second transistor T2 and the light emitting diode 120 and may be controlled by the emission control signal EM supplied through the emission control signal line. When a turn-on level emission control signal EM is applied in a state in which the data signal Vdata is applied to the capacitor Cst and a high potential power signal EVDD in which the threshold voltage is compensated is applied to the gate electrode of the second transistor T2, the fifth transistor T5 is turned on. Therefore, the current may flow through the light emitting diode 120.

The sixth transistor T6 is electrically connected between the initialization signal line through which the initialization signal Vini is supplied and an anode of the light emitting diode 120 and may be controlled by the first scan signal SCAN1 supplied through the first scan line. When a turn-on level first scan signal SCAN1 is applied through the first scan line, the sixth transistor T6 may initialize the anode of the light emitting diode 120 or a node between the second transistor T2 and the fifth transistor T5, with the initialization signal Vini.

The capacitor Cst may be a storage capacitor Cst which stores a voltage applied to the gate electrode of the second transistor T2 serving as a driving transistor. Here, the capacitor Cst is electrically connected between the gate electrode of the second transistor T2 and the anode of the light emitting diode 120. Accordingly, the capacitor Cst may store a difference between the voltage of the gate electrode of the second transistor T2 and a voltage applied to the anode of the light emitting diode 120.

In the present specification, even though it is described that the pixel circuit of the plurality of sub pixels SP includes the first to sixth transistors T1, T2, T3, T4, T5, and T6 and the capacitor Cst, the number of transistors and capacitors may vary depending on the design.

Hereinafter, the sub pixel SP of the display apparatus 100 according to the exemplary embodiment of the present disclosure will be described in more detail with reference to FIGS. 3A and 3B.

Figure 3A:
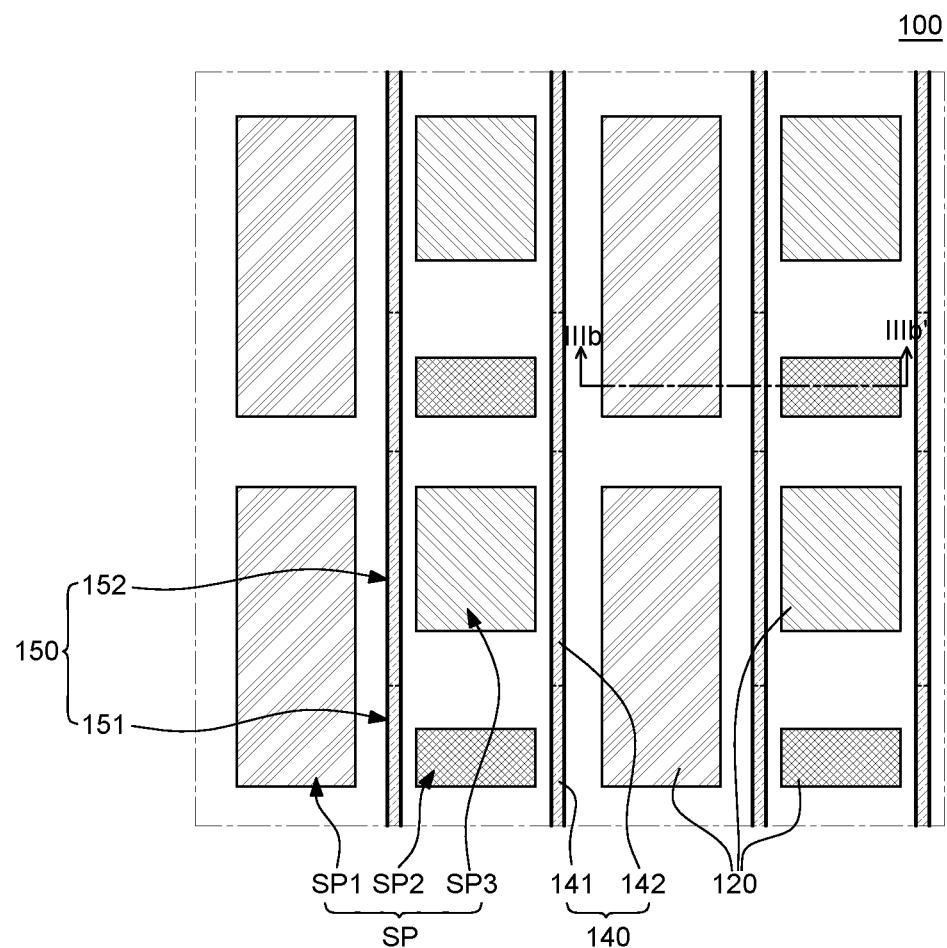
FIG. 3A is an enlarged plan view of a display apparatus according to an exemplary embodiment of the present disclosure.

FIG. 3A is an enlarged plan view of a display apparatus according to an exemplary embodiment of the present disclosure. FIG. 3B is a cross-sectional view taken along the line IIIb-IIIb' of FIG. 3A. Referring to FIGS. 3A and 3B, the display apparatus 100 according to the exemplary embodiment of the present disclosure includes a substrate 110, a buffer layer 111, a gate insulating layer 112, an interlayer insulating layer 113, a passivation layer 114, a planarization layer 115, a bank 116, a fifth transistor T5, a light emitting diode 120, a conductive layer 140, and an auxiliary light emitting diode 150. In FIG. 3B, for the convenience of description, only the fifth transistor T5 among the plurality of transistors T1, T2, T3, 14, T5, and T6 and the capacitor Cst of the pixel circuit are illustrated.

Referring to FIG. 3A, the plurality of sub pixels SP are individual units which emit light and the light emitting diode 120 is disposed in each of the plurality of sub pixels SP. The plurality of sub pixels SP include a first sub pixel SP1, a second sub pixel SP2, and a third sub pixel SP3 which emit different color light. For example, the first sub pixel SP1 is a blue sub pixel, the second sub pixel SP2 is a red sub pixel, and the third sub pixel SP3 is a green sub pixel.

The first sub pixel SP1, the second sub pixel SP2, and the third sub pixel SP3 may have different turn-on voltages. At this time, for example, the first sub pixels SP1 has the highest turn-on voltage, the second sub pixels SP2 has the lowest turn-on voltage, and a turn-on voltage of the third sub pixel SP3 may be between the turn-on voltage of the first sub pixels SP1 and the turn-on voltage of the second sub pixels SP2.

The plurality of first sub pixels SP1 may be disposed to form a plurality of columns. That is, the plurality of first sub pixels SP1 may be disposed in the same column. The plurality of second sub pixels SP2 and the plurality of third sub pixels SP3 may be disposed between the plurality of columns in which the plurality of first sub pixels are disposed. For example, the plurality of first sub pixels SP1 are disposed in one column and the second sub pixels SP2 and the third sub pixels SP3 may be disposed together in an adjacent column. Further, the plurality of second sub pixels SP2 and the plurality of third sub pixels SP3 may be alternately disposed in the same column. In this specification, it is described that the plurality of sub pixels SP includes the first sub pixel SP1, the second sub pixel SP2, and the third sub pixel SP3. However, the placement, the number and a color combination of the plurality of sub pixels SP may vary in various ways depending on a design and are not limited thereto.

Figure 3B:
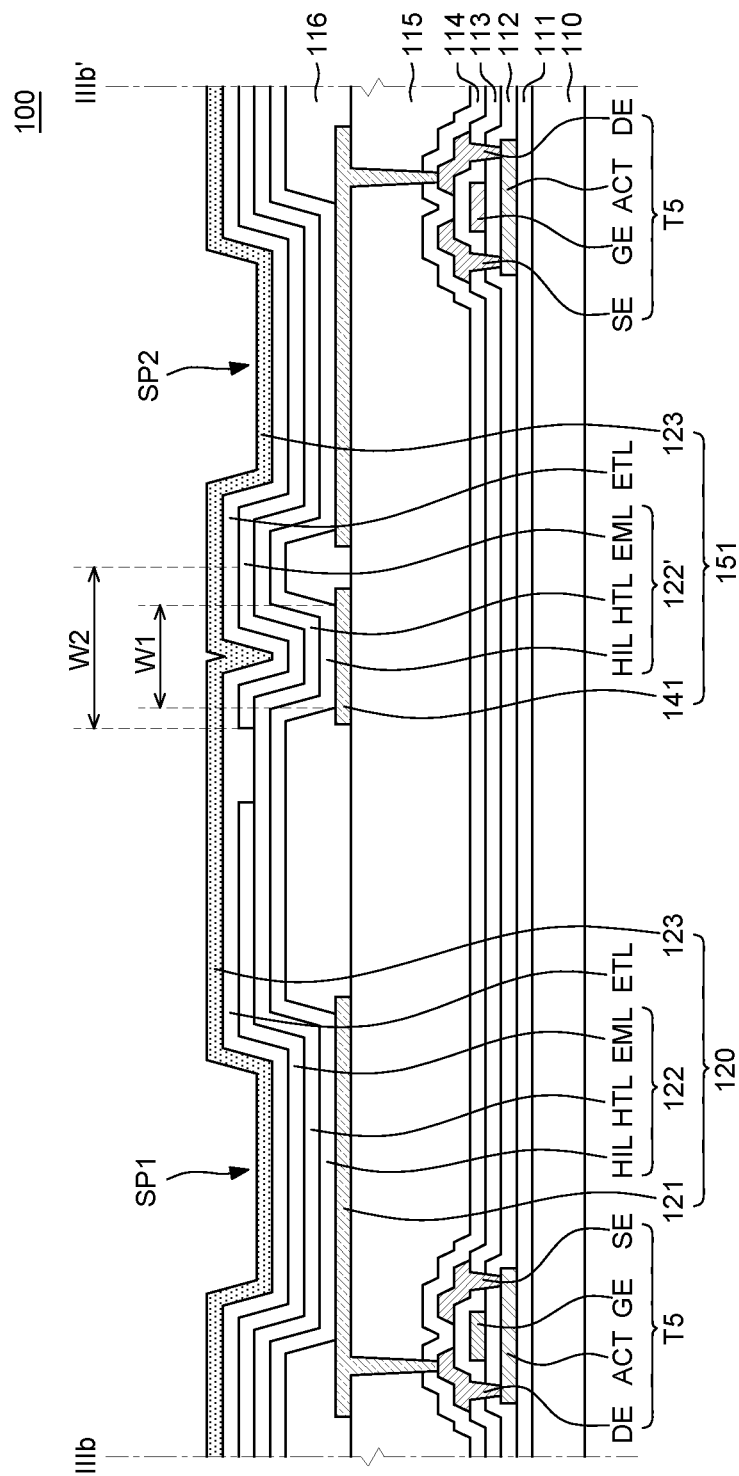
FIG. 3B is a cross-sectional view taken along the line IIIb-IIIb' of FIG. 3A.

Referring to FIG. 3B, the substrate 110 is a support member for supporting other components of the display apparatus 100 and may be configured by an insulating material. For example, the substrate 110 may be formed of glass, resin, or the like. Further, the substrate 110 may be configured to include plastics such as polymer or polyimide (PI) or may be formed of a material having flexibility.

The buffer layer 111 is disposed on the substrate 110. The buffer layer 111 may reduce permeation of moisture or impurities through the substrate 110. The buffer layer 111 may be configured by a single layer or a double layer of silicon oxide SiOx or silicon nitride SiNx, but is not limited thereto. However, the buffer layer 111 may be omitted depending on a type of substrate 110 or a type of transistor, but is not limited thereto.

The fifth transistor T5 is disposed on the buffer layer 111. The fifth transistor T5 includes an active layer AC, a gate electrode GE, a source electrode SE, and a drain electrode DE.

The active layer ACT may be formed of a semiconductor material such as an oxide semiconductor, amorphous silicon, or polysilicon, but is not limited thereto. For example, when the active layer ACT is formed of an oxide semiconductor, the active layer ACT is configured by a channel region, a source region, and a drain region and the source region and the drain region may be conductive regions, but are not limited thereto.

The gate insulating layer 112 is disposed on the active layer ACT. The gate insulating layer 112 is an insulating layer which insulates the active layer ACT from the gate electrode GE and may be configured by a single layer or a double layer of silicon oxide SiOx or silicon nitride SiNx, but is not limited thereto.

The gate electrode GE is disposed on the gate insulating layer 112. The gate electrode GE may be configured by a conductive material such as copper (Cu), aluminum (Al), molybdenum (Mo), nickel (Ni), titanium (Ti), chrome (Cr), or an alloy thereof, but is not limited thereto.

The interlayer insulating layer 113 is disposed on the gate electrode GE. In the interlayer insulating layer 113, a contact hole through which the source electrode SE and the drain electrode DE are connected to the active layer ACT is formed. The interlayer insulating layer 113 may be configured by a single layer or a double layer of silicon oxide SiOx or silicon nitride SiNx, but is not limited thereto.

The source electrode SE and the drain electrode DE are disposed on the interlayer insulating layer 113. The source electrode SE and the drain electrode DE which are disposed to be spaced apart from each other may be electrically connected to the active layer ACT. The source electrode SE and the drain electrode DE may be configured by a conductive material, such as copper (Cu), aluminum (Al), molybdenum (Mo), nickel (Ni), titanium (Ti), chrome (Cr), or an alloy thereof, but are not limited thereto.

The passivation layer 114 is disposed on the source electrode SE and the drain electrode DE. The passivation layer 114 is an insulating layer for protecting components below the passivation layer 114. For example, the passivation layer 114 may be configured by a single layer or a double layer of silicon oxide SiOx or silicon nitride SiNx, but is not limited thereto. Further, the passivation layer 114 may be omitted depending on the exemplary embodiment.

The planarization layer 115 is disposed on the passivation layer 114. The planarization layer 115 is disposed between the substrate 110 and the plurality of light emitting diodes 120. The planarization layer 115 is an insulating layer which planarizes an upper portion of the substrate 110. The planarization layer 115 may be formed of an organic material, and for example, may be configured by a single layer or a double layer of polyimide or photo acryl, but is not limited thereto.

The plurality of light emitting diodes 120 is disposed in each of the plurality of sub pixels SP on the planarization layer 115. The light emitting diode 120 includes an anode 121, an organic layer 122, and a cathode 123.

The anode 121 is disposed on the planarization layer 115. The anode 121 is electrically connected to a transistor of the pixel circuit, for example, the second transistor T2 and the fifth transistor T5 to be supplied with a driving current. The anode 121 supplies holes to the organic layer 122 so that the anode may be formed of a conductive material having a high work function. For example, the anode 121 may be formed of a transparent conductive material such as indium tin oxide (ITO) and indium zinc oxide (IZO), but is not limited thereto.

In the meantime, the display apparatus 100 may be implemented by a top emission type or a bottom emission type. When the display apparatus is a top emission type, a reflective layer which is formed of a metal material having an excellent reflection efficiency such as aluminum (Al) or silver (Ag), may be added below the anode 121. Therefore, light emitted from the organic layer 122 is reflected from the anode 121 to be directed to the upper direction, that is, the cathode 123. In contrast, when the display apparatus 100 is a bottom emission type, the anode 121 may be only formed of a transparent conductive material. Hereinafter, the description will be made under the assumption that the display apparatus 100 according to the exemplary embodiment of the present disclosure is a top emission type.

The conductive layer 140 is disposed between the plurality of sub pixels SP. Specifically, the conductive layer 140 may be disposed on the planarization layer 115 between the plurality of sub pixels SP. Therefore, the conductive layer 140 may be formed on the same layer as the anode 121 and may be formed of the same material as the anode 121. However, it is not limited thereto so that the conductive layer 140 may be formed on a different layer from that of the anode 121 and may be formed of a different material.

The conductive layer 140 is disposed to be close to a sub pixel having a low turn-on voltage between the plurality of sub pixels SP. For example, the conductive layer may be disposed to be close to the second sub pixels SP2 between the first sub pixels SP1 and the second sub pixel SP2 and disposed to be close to the third sub pixel SP3 between the first sub pixels SP1 and the third sub pixel SP3. At this time, the conductive layer 140 may include a first conductive layer 141 which is disposed to be closer to the second sub pixels SP2 between the first sub pixels SP1 and the second sub pixel SP2 and a second conductive layer 142 which is disposed to be closer to the third sub pixel SP3 between the first sub pixels SP1 and the third sub pixel SP3. In FIG. 3A, even though it is illustrated that the first conductive layer 141 and the second conductive layer 142 are connected, it is not limited thereto and the first conductive layer 141 and the second conductive layer 142 may be separated from each other.

The conductive layer 140 is electrically floated. For example, the conductive layer 140 is not electrically connected to the transistor or the wiring line, so that a separate voltage may not be applied thereto at all times.

The bank 116 is disposed on the anode 121 and the planarization layer 115. Therefore, the bank 116 is disposed below the cathode 123 between the plurality of light emitting diodes 120, respectively. The bank 116 is an insulating layer disposed between the plurality of sub pixels SP to divide the plurality of sub pixels SP. The bank 116 includes an opening which exposes a part of the anode 121 and the conductive layer 140. The bank 116 may be an organic insulating material disposed to cover an end or an edge of the anode 121. For example, the bank 116 may be formed of a polyimide resin, an acrylic resin, or benzocyclobutene (BCB) resin, but is not limited thereto.

The organic layer 122 is disposed on the anode 121 and the bank 116. The organic layer 122 includes an emission layer EML and common organic layers HIL, HTL, and ETL. The emission layer EML is an organic layer 122 which emits light having a specific color and different emission layers EML may be disposed in the first sub pixel SP1, the second sub pixel SP2, and the third sub pixel SP3, respectively. For example, the emission layer EML disposed in the first sub pixel SP1 is a blue emission layer, the emission layer EML disposed in the second sub pixel SP2 is a red emission layer, and the emission layer EML disposed in the third sub pixel SP3 is a green emission layer.

The common organic layers HIL, HTL, ETL are layers disposed to improve a luminous efficiency of the emission layer EML. The common organic layers HIL, HTL, ETL are formed as one layer over the plurality of sub pixels SP to be shared by the plurality of light emitting diodes 120. That is, the common organic layers HIL, HTL, ETL of the plurality of sub pixels SP are connected to be integrally formed. The common organic layers HIL, HTL, ETL may include a hole injection layer HIL, a hole transport layer HTL, an electron transport layer ETL, and the like, but are not limited thereto.

Further, a plurality of emission layers EML which emits the same color light may be laminated on one sub pixel SP. For example, two blue emission layers are laminated on the first sub pixel SP1, two red emission layers are laminated on the second sub pixel SP2, and two green emission layers are laminated on the third sub pixel SP3. In this case, a charge generation layer CGL is disposed between the plurality of emission layers EML to smoothly supply electrons or holes to each of the plurality of emission layers EML. That is, the charge generation layer may be disposed between two blue emission layers, between two green emission layers, and two red emission layers.

The cathode 123 is disposed on the organic layer 122. The cathode 123 supplies electrons to the organic layer 122 so that the cathode may be formed of a conductive material having a low work function. The cathode 123 may be formed as one layer over the plurality of sub pixels SP. That is, the cathodes 123 of the plurality of sub pixels SP are connected to be integrally formed. For example, the cathode 123 may be formed of a transparent conductive material such as indium tin oxide (ITO) and indium zinc oxide (IZO), or a metal alloy such as MgAg or a ytterbium (Yb) alloy and may further include a metal doping layer, but is not limited thereto. In the meantime, even though not illustrated in the drawing, the cathode 123 is electrically connected to the low potential power line to be supplied with a low potential power signal EVSS.

Referring to FIG. 3B, the emission layer EML of the light emitting diode 120 of the second sub pixel SP2 may be disposed on the conductive layer 140 disposed to be adjacent to the second sub pixel SP2. As described above, the conductive layer 140 is disposed to be adjacent to a sub pixel SP having a lower turn-on voltage between two adjacent sub pixels SP so that the conductive layer 140 may be disposed to be adjacent to the second sub pixel SP2 between the first sub pixel SP1 and the second sub pixel SP2. At this time, the emission layer EML is disposed to be separated for every sub pixel SP. In this case, a part of the emission layer EML is disposed on the bank 116 due to a margin of a fine metal mask FMM used for the process of forming the emission layer EML or a reduced interval between the sub pixels SP in accordance with the high resolution of the display apparatus 100. Accordingly, a part of the emission layer EML disposed in the second sub pixel SP2 is disposed on the conductive layer 140 disposed to be adjacent to the second sub pixel SP2. Therefore, the organic layer 122 and the cathode 123 are disposed on the conductive layer 140 and the conductive layer 140, the organic layer 122, and the cathode 123 may serve as the auxiliary light emitting diode 150.

At this time, the auxiliary light emitting diode 150 may include a first auxiliary light emitting diode 151 and a second auxiliary light emitting diode 152. The first auxiliary light emitting diode 151 emits light having the same color as the second sub pixel SP2 between the first sub pixel SP1 and the second sub pixel SP2 and the second auxiliary light emitting diode 152 emits light having the same color as the third sub pixel SP3 between the first sub pixel SP1 and the third sub pixel SP3. Specifically, a part of the emission layer EML disposed in the second sub pixel SP2 is disposed on the first conductive layer 141 between the first sub pixel SP1 and the second sub pixel SP2. Therefore, the first conductive layer 141, the organic layer 122' and the cathode 123 disposed on the first conductive layer 141 may form the first auxiliary light emitting diode 151 and the first auxiliary light emitting diode 151 may emit light having the same color as the second sub pixel SP2. Further, a part of the emission layer EML disposed in the third sub pixel SP3 is disposed on the second conductive layer 142 between the first sub pixel SP1 and the third sub pixel SP3. Therefore, the second conductive layer 142, the organic layer 122' and the cathode 123 disposed on the second conductive layer 142 may form the second auxiliary light emitting diode 152 and the second auxiliary light emitting diode 152 may emit light having the same color as the third sub pixel SP3.

At this time, an emission area of the auxiliary light emitting diodes 150 may be smaller than an emission area of the plurality of light emitting diodes 120. That is, an area of the first conductive layer 141 exposed by the bank 116 which is the emission area of the first auxiliary light emitting diodes 151 and an area of the second conductive layer 142 exposed by the bank 116 which is the emission area of the second auxiliary light emitting diodes 152 may be smaller than an area of the anode 121 exposed by the bank 116 in each of the plurality of sub pixels SP.

Referring to FIG. 3B, a width W2 of the emission layer EML disposed on the first conductive layer 141 may be larger than a width W1 of the first conductive layer 141 exposed by the bank 116. That is, the emission layer EML of the organic layer 122' disposed on the first conductive layer 141 is disposed on the bank 116 due to the margin of the fine metal mask FMM. Therefore, the width W2 of the emission layer EML disposed on the first conductive layer 141 may be larger than a width W1 of the first conductive layer 141 exposed by the bank 116. Further, a width of the emission layer EML disposed on the second conductive layer 142 may be larger than a width of the second conductive layer 142 exposed by the bank 116.

Hereinafter, the effect of the display apparatus 100 according to the exemplary embodiment of the present disclosure will be described in more detail with reference to FIGS. 4A to 6.

Figure 4A:
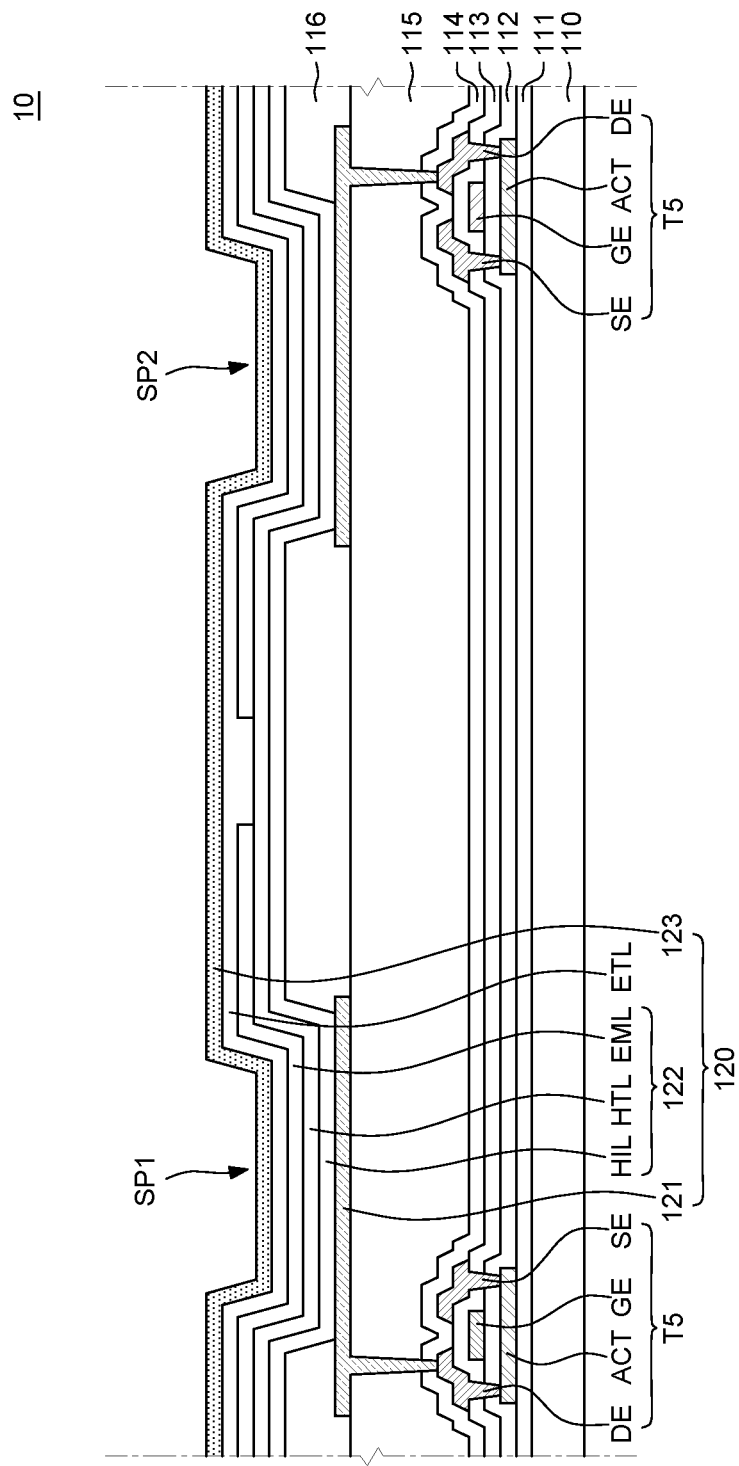
FIG. 4A is a cross-sectional view of a display apparatus according to a comparative embodiment.
Figure 4B:
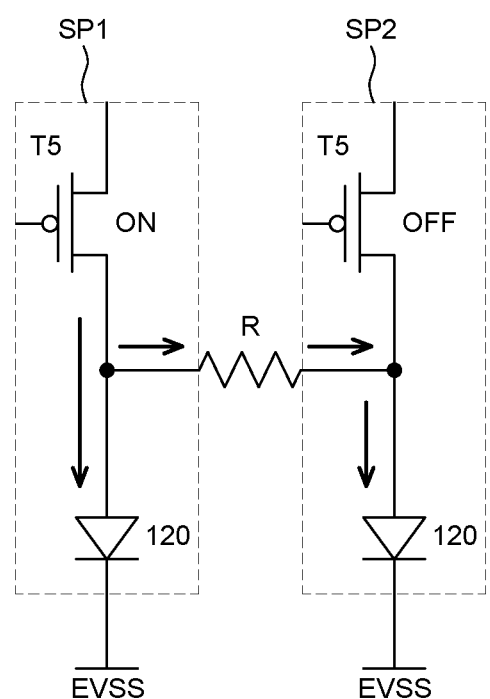
FIG. 4B is an equivalent circuit diagram of a display apparatus according to a comparative embodiment.
Figure 5:
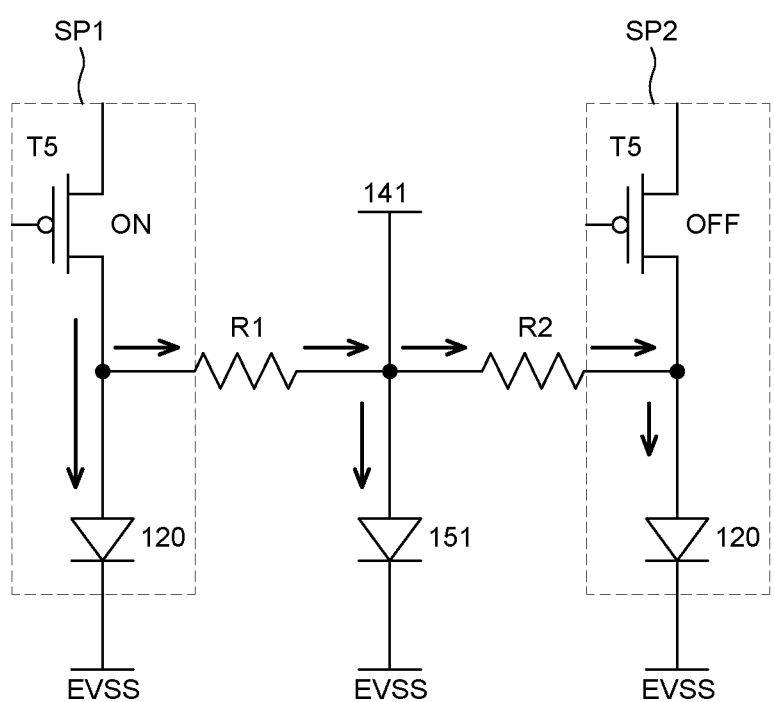
FIG. 5 is an equivalent circuit diagram of a display apparatus according to an exemplary embodiment of the present disclosure.
Figure 6:
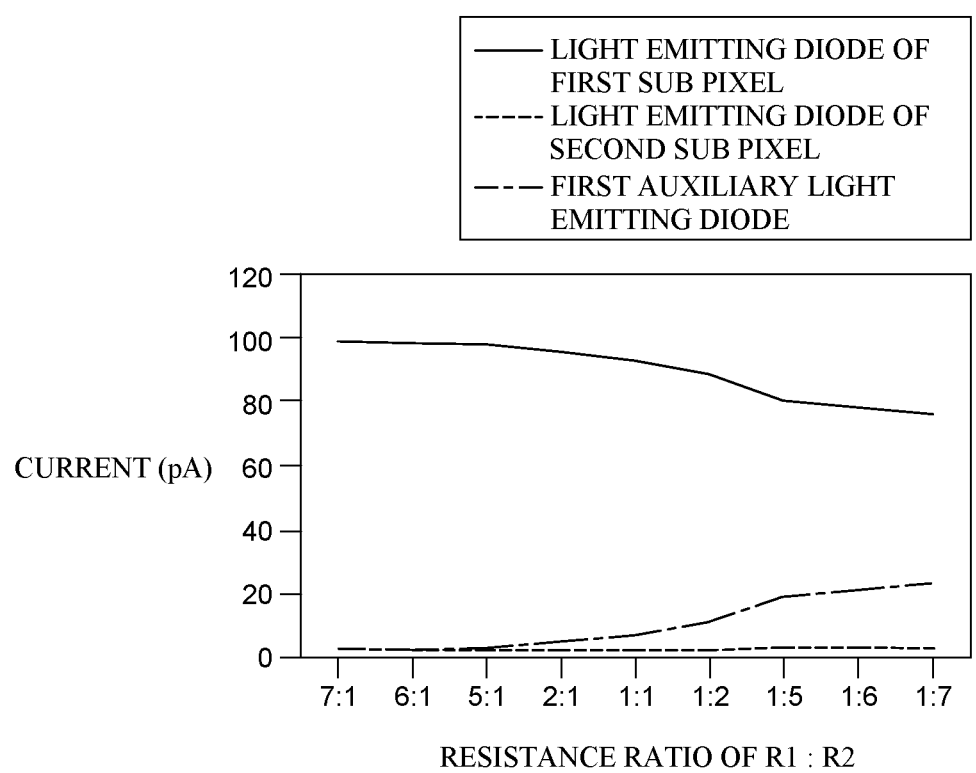
FIG. 6 is a graph for explaining an effect of a display apparatus according to an exemplary embodiment of the present disclosure.

FIG. 4A is a cross-sectional view of a display apparatus according to a comparative embodiment. FIG. 4B is a circuit diagram of a display apparatus according to a comparative embodiment. FIG. 5 is a circuit diagram of a display apparatus according to an exemplary embodiment of the present disclosure. FIG. 6 is a simulation result of a current flowing through a plurality of light emitting diodes of a display apparatus according to an exemplary embodiment of the present disclosure. As compared with the display apparatus 100 of FIGS. 1 to 3B, the only difference of a display apparatus 10 of a comparative embodiment of FIGS. 4A and 4B is that a conductive layer 140 is not included, but other configurations are substantially the same, so that a redundant description will be omitted. FIGS. 4B and 5B illustrate equivalent circuit diagrams using an equivalent resistance R for a leakage current path by the fifth transistor T5 and the light emitting diode 120 of the first sub pixel SP1 and the second sub pixel SP2 which are adjacent to each other, and the common organic layers HIL, HTL, and ETL between the first sub pixel SP1 and the second sub pixel SP2, a first equivalent resistance R1 for a leakage current path by the common organic layers HIL, HTL, and ETL between the first sub pixel SP1 and the first conductive layer 141, and a second equivalent resistance R2 for a leakage current path by the common organic layers HIL, HTL, and ETL between the second sub pixel SP2 and the first conductive layer 141. In FIGS. 4B and 5B, it is illustrated that the fifth transistor T5 of the first sub pixel SP1 is turned on, but the fifth transistor T5 of the second sub pixel SP2 is turned off. FIG. 6 illustrates a current pA which flows through the light emitting diode 120 of the first sub pixel SP1, the light emitting diode 120 of the second sub pixel SP2, and the first auxiliary light emitting diode 151 as a resistance ratio of the first equivalent resistance R1 and the second equivalent resistance R2 changes when only the first sub pixel SP1 is turned on.

Referring to FIGS. 4A and 4B, in the display apparatus 10 according to the comparative embodiment, the common organic layers HIL, HTL, and ETL of the plurality of light emitting diodes 120 are formed as one layer over all the plurality of sub pixels SP.

At this time, as the light emitting diodes 120 of the plurality of sub pixels SP are formed to share the common organic layers HIL, HTL, and ETL, a phenomenon that when a light emitting diode 120 of the first sub pixel SP1 emits light, the current flows to the light emitting diode 120 of the adjacent second sub pixel SP2, that is, current leakage phenomenon may occur. The current leakage phenomenon causes the light emitting diode 120 of unintended sub pixel SP to emit light, which causes color mixture between the plurality of sub pixels SP and increases the power consumption. Further, color abnormality and spots are visibly recognized due to the leakage current so that a display quality may be degraded. For example, when only the first sub pixel SP1 among the plurality of sub pixels SP emits light, a part of current supplied to drive the light emitting diode 120 of the first sub pixel SP1 may be leaked to the second sub pixel SP2 adjacent thereto by means of the common organic layers HIL, HTL, and ETL.

Further, emission layers EML which are separately disposed for each of the plurality of sub pixels SP have different turn-on voltages. For example, a turn-on voltage for driving the first sub pixel SP1 on which the blue emission layer is disposed may be the highest and a turn-on voltage for driving the second sub pixel SP2 on which the red emission layer is disposed may be the lowest. A barrier through which the current flows is low in the second sub pixel SP2 having a turn-on voltage lower than that of the first sub pixel SP1 having the highest turn-on voltage. Therefore, the current leaked through the common organic layers HIL, HTL, and ETL may easily flow from the first sub pixel SP1 having the high turn-on voltage to the second sub pixel SP2 having the low turn-on voltage. As a result, when the first sub pixel SP1 is driven, the second sub pixel SP2 having a low turn-on voltage may emit light together.

Specifically, during the low grayscale driving, a luminance of light emitted from a sub pixel SP which is being driven is low so that light emitted from the adjacent sub pixels SP may be more easily recognized. That is, during the low grayscale driving, color abnormality and spot defect due to the leakage current are more easily recognized, which may cause serious degradation in the display quality. Further, when white light with a low grayscale is displayed, the second sub pixel SP2 having the lowest turn-on voltage emits the light first through the common organic layers HIL, HTL, and ETL, so that reddish phenomenon that reddish white is displayed rather than pure white may occur.

In the meantime, referring to FIGS. 1 to 3B and 5, in the display apparatus 100 according to the exemplary embodiment of the present disclosure, a floating conductive layer 140 is disposed between the plurality of sub pixels SP and the conductive layer 140, the organic layer 122, and the cathode 123 may serve as an auxiliary light emitting diode 150. Therefore, when the first sub pixel SP1 is driven, a current leaked from the first sub pixel SP1 may flow to the cathode 123 disposed on the first conductive layer 141 and the second conductive layer 142 by the first conductive layer 141 disposed between the first sub pixel SP1 and the second sub pixel SP2 and the second conductive layer 142 disposed between the first sub pixel SP1 and the third sub pixel SP3. By doing this, when the first sub pixel SP1 is driven, the leakage current flowing from the first sub pixel SP1 to the second sub pixel SP2 and the third sub pixel SP3 may be reduced. Accordingly, in the display apparatus 100 according to the exemplary embodiment of the present disclosure, the conductive layer 140 is disposed between the first sub pixel SP1 and the second sub pixel SP2 and the third sub pixel SP3 to reduce the leakage current flowing from the first sub pixel SP1 having the highest turn-on voltage to the second sub pixel SP2 and the third sub pixel SP3. Further, the degradation of the display quality due to color mixture, spots, or abnormal colors may be minimized.

In the meantime, referring to FIG. 6, a current which flows through the light emitting diode 120 of the first sub pixel SP1, the light emitting diode 120 of the second sub pixel SP2, and the first auxiliary light emitting diode 151 may be changed as a resistance ratio of the first equivalent resistance R1 and the second equivalent resistance R2 changes. For example, when the second equivalent resistance is increased as compared with a case that a first equivalent resistance R1 and a second equivalent resistance R2 are equal, that is, the first conductive layer 141 is disposed between the first sub pixel SP1 and the second sub pixel SP2, a current flowing to the light emitting diode 120 of the first sub pixel SP1 is reduced. Accordingly, when the second equivalent resistance R2 is higher than the first equivalent resistance R1, that is, when the first conductive layer 141 is disposed to be closer to the first sub pixel SP1, the luminous efficiency of the first sub pixel SP1 is reduced, which may degrade the luminance.

Therefore, in the display apparatus 100 according to the exemplary embodiment of the present disclosure, the first conductive layer 141 may be disposed to be adjacent to the sub pixel SP having a relatively low turn-on voltage. That is, the first conductive layer 141 is disposed to be more adjacent to the second sub pixel SP2 having a lower turn-on voltage between the first sub pixel SP1 and the second sub pixel SP2 to minimize the reduction of the luminance of the first sub pixel SP1.

Here, when the first conductive layer 141 is disposed to be adjacent to the second sub pixel SP2 so that the second sub pixel SP2 is turned on and the first sub pixel SP1 is turned off, the luminance of the second sub pixel SP2 may be reduced. However, as described above, the first conductive layer 141 is disposed to be adjacent to the second sub pixel SP2 so that the emission layer EML and the cathode 123 of the second sub pixel SP2 may be disposed on the first conductive layer 141. Accordingly, the first auxiliary light emitting diode 151 may also emit the same light as the light emitting diode 120 disposed in the second sub pixel SP2, for example, red light. Therefore, in the display apparatus 100 according to the exemplary embodiment of the present disclosure, the first auxiliary light emitting diode 151 is implemented using the first conductive layer 141 disposed to be adjacent to the second sub pixel SP2 to solve the problem of the degradation of the luminance caused when the second sub pixel SP2 is driven.

In the meantime, as described above, in order to improve the degradation of the luminance of the first sub pixel SP1 caused when the first conductive layer 141 is disposed to be adjacent to the first sub pixel SP1, a method of allowing the first auxiliary light emitting diode 151 to emit light having the same color as the first sub pixel SP1 by disposing the emission layer EML of the first sub pixel SP1 on the first conductive layer 141 disposed to be adjacent to the first sub pixel SP1 may be considered. However, when the first conductive layer 141 is disposed to be adjacent to the first sub pixel SP1 to allow the first auxiliary light emitting diode 151 to emit blue light which is the same as the first sub pixel SP1, the first auxiliary light emitting diode 151 may serve as a light emitting diode which substantially emits blue light. However, in this case, the first sub pixel SP1 may be defined as an area including the first auxiliary light emitting diode 151 so that a distance between the second sub pixel SP2 having a relatively low turn-on voltage and the first sub pixel SP1 having a relatively higher turn-on voltage may be closer. Accordingly, more leakage current from the light emitting diode 120 of the first sub pixel SP1 and the first auxiliary light emitting diode 151 may flow to the second sub pixel SP2. As a result, in the display apparatus 100 according to the exemplary embodiment of the present disclosure, the conductive layer 140 is disposed to be adjacent to the sub pixel SP having a relatively lower turn-on voltage to reduce the leakage current flowing to the second sub pixel SP2 and minimize the reduction of the luminance of the first sub pixel SP1.

In the meantime, a second auxiliary light emitting diode 152 may also perform the same function as the first auxiliary light emitting diode 151. That is, the second auxiliary light emitting diode 152 may be disposed to be more adjacent to the third sub pixel SP3, between the third sub pixel SP3 having a relatively lower turn-on voltage and the first sub pixel SP1 having a relatively higher turn-on voltage. Therefore, the second auxiliary light emitting diode 152 may reduce the leakage current flowing to the third sub pixel SP3 and minimize the reduction of the luminance of the first sub pixel SP1.

Figure 7:
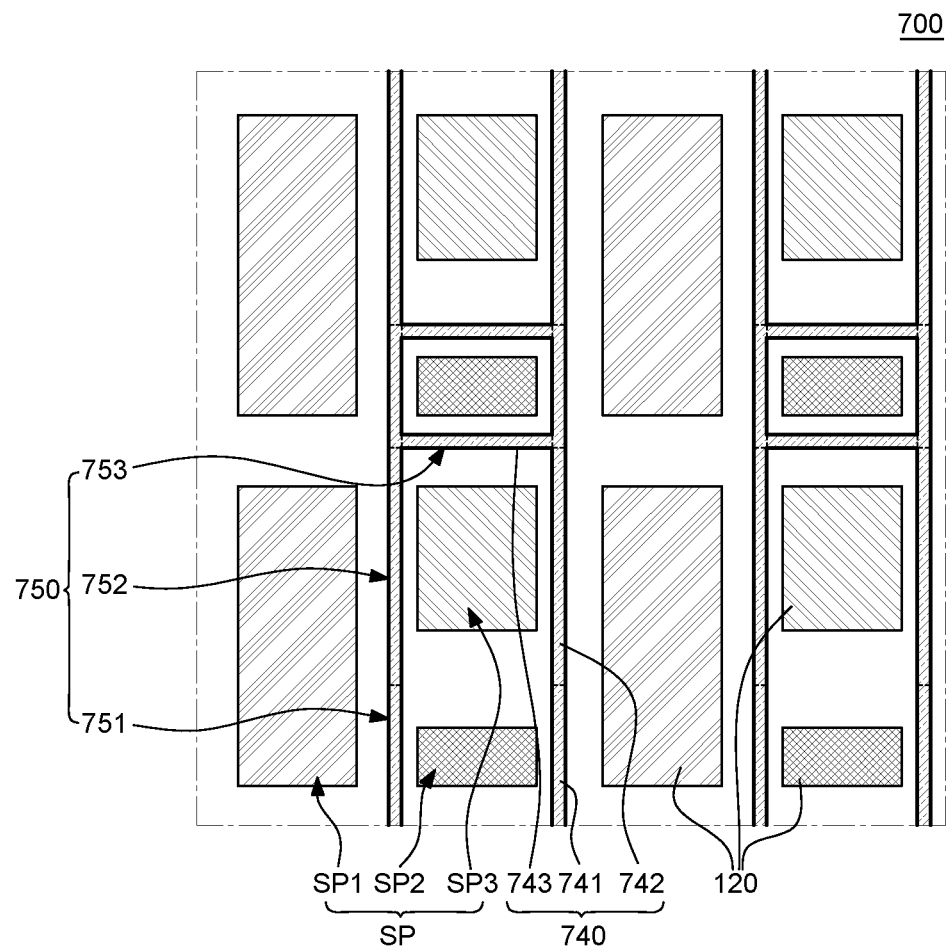
FIG. 7 is an enlarged plan view of a display apparatus according to another exemplary embodiment of the present disclosure.

FIG. 7 is an enlarged plan view of a display apparatus according to another exemplary embodiment of the present disclosure. The only difference of the display apparatus 700 of FIG. 7 from the display apparatus 100 of FIGS. 1 to 3B is that a conductive layer 740 and an auxiliary light emitting diode 750 are further disposed between the second sub pixel SP2 and the third sub pixel SP3, but other configurations are substantially the same. Therefore, a redundant description will be omitted.

A plurality of sub pixels SP include a third sub pixel SP3 having a turn on voltage which is lower than a turn-on voltage of the first sub pixel SP1 and is higher than a turn-on voltage of the second sub pixel SP2. For example, the first sub pixel SP1 is a blue sub pixel, the second sub pixel SP2 is a red sub pixel, and the third sub pixel SP3 is a green sub pixel. Therefore, the first sub pixel SP1 includes a blue emission layer, the second sub pixel SP2 has a red emission layer, and the third sub pixel SP3 has a green emission layer.

Referring to FIG. 7, the conductive layer 740 is further disposed between the third sub pixel SP3 and the second sub pixel SP2. The conductive layer 740 is disposed to be closer to the second sub pixel SP2 between the third sub pixel SP3 and the second sub pixel SP2. Specifically, the conductive layer 740 may include a first conductive layer 741, a second conductive layer 742, and a third conductive layer 743. The first conductive layer 741 is disposed to be closer to the second sub pixels SP2 between the first sub pixels SP1 and the second sub pixel SP2. The second conductive layer 742 is disposed to be closer to the third sub pixel SP3 between the first sub pixels SP1 and the third sub pixel SP3. The third conductive layer 743 is disposed to be closer to the second sub pixel SP2 between the second sub pixel SP2 and the third sub pixel SP3. In FIG. 7, even though it is illustrated that the first conductive layer 741, the second conductive layer 742, and the third conductive layer 743 are connected, it is not limited thereto so that the first conductive layer 741, the second conductive layer 742, and the third conductive layer 742 may be separated.

The auxiliary light emitting diode 750 may include a first auxiliary light emitting diode 751, a second auxiliary light emitting diode 752, and a third auxiliary light emitting diode 753. The first auxiliary light emitting diode 751 emits light having the same color as the second sub pixel SP2 between the first sub pixel SP1 and the second sub pixel SP2, and the second auxiliary light emitting diode 752 emits light having the same color as the third sub pixel SP3 between the first sub pixel SP1 and the third sub pixel SP3. Further, the third auxiliary light emitting diode 753 emits light having the same color as the second sub pixel SP2 between the second sub pixel SP2 and the third sub pixel SP3. Specifically, a part of the emission layer EML disposed in the second sub pixel SP2 is disposed on the first conductive layer 741 between the first sub pixel SP1 and the second sub pixel SP2. Therefore, the first conductive layer 141, the organic layer 122' and the cathode 123 disposed on the first conductive layer 141 may form the first auxiliary light emitting diode 751, and the first auxiliary light emitting diode 751 may emit light having the same color as the second sub pixel SP2. Further, a part of the emission layer EML disposed in the third sub pixel SP3 is disposed on the second conductive layer 742 between the first sub pixel SP1 and the third sub pixel SP3. Therefore, the second conductive layer 742, the organic layer 122 and the cathode 123 disposed on the second conductive layer 742 may form the second auxiliary light emitting diode 752 and the second auxiliary light emitting diode 752 may emit light having the same color as the third sub pixel SP3. Further, a part of the emission layer EML disposed in the second sub pixel SP2 is disposed on the third conductive layer 743 between the second sub pixel SP2 and the third sub pixel SP3. Therefore, the third conductive layer 743 and the organic layer 122 and the cathode 123 disposed on the third conductive layer 743 may form the third auxiliary light emitting diode 753, and the third auxiliary light emitting diode 753 may emit light having the same color as the second sub pixel SP2.

In the display apparatus 700 according to another exemplary embodiment of the present disclosure, a floating conductive layer 740 is further disposed between the third sub pixel SP3 and the second sub pixel SP2 and the conductive layer 740, the organic layer, and the cathode may serve as an auxiliary light emitting diode 750. Therefore, when the third sub pixel SP3 is driven, the current leaked from the third sub pixel SP3 may flow to the cathode disposed on the conductive layer 740 by the conductive layer 740 disposed between the third sub pixel SP3 and the second sub pixel SP2. By doing this, when the third sub pixel SP3 is driven, the leakage current flowing from the third sub pixel SP3 to the second sub pixel SP2 may be reduced. Accordingly, in the display apparatus 700 according to another exemplary embodiment of the present disclosure, the conductive layer 740 is further disposed between the second sub pixel SP2 and the third sub pixel SP3 to reduce the leakage current flowing from the first sub pixel SP1 having the highest turn-on voltage to the second sub pixel SP2 and the third sub pixel SP3. Simultaneously, the leakage current flowing from the third sub pixel SP3 having a higher turn-on voltage to the second sub pixel SP2 is reduced and the degradation of the display quality due to color mixture, spots, or abnormal colors may be minimized.

Further, in the display apparatus 700 according to another exemplary embodiment of the present disclosure, the conductive layer 740 may be disposed to be adjacent to the sub pixel SP having a relatively low turn-on voltage. That is, the conductive layer 740 is disposed to be more adjacent to the second sub pixel SP2 having a lower turn-on voltage between the third sub pixel SP3 and the second sub pixel SP2 to minimize the reduction of the luminance of the third sub pixel SP3.

Figure 8:
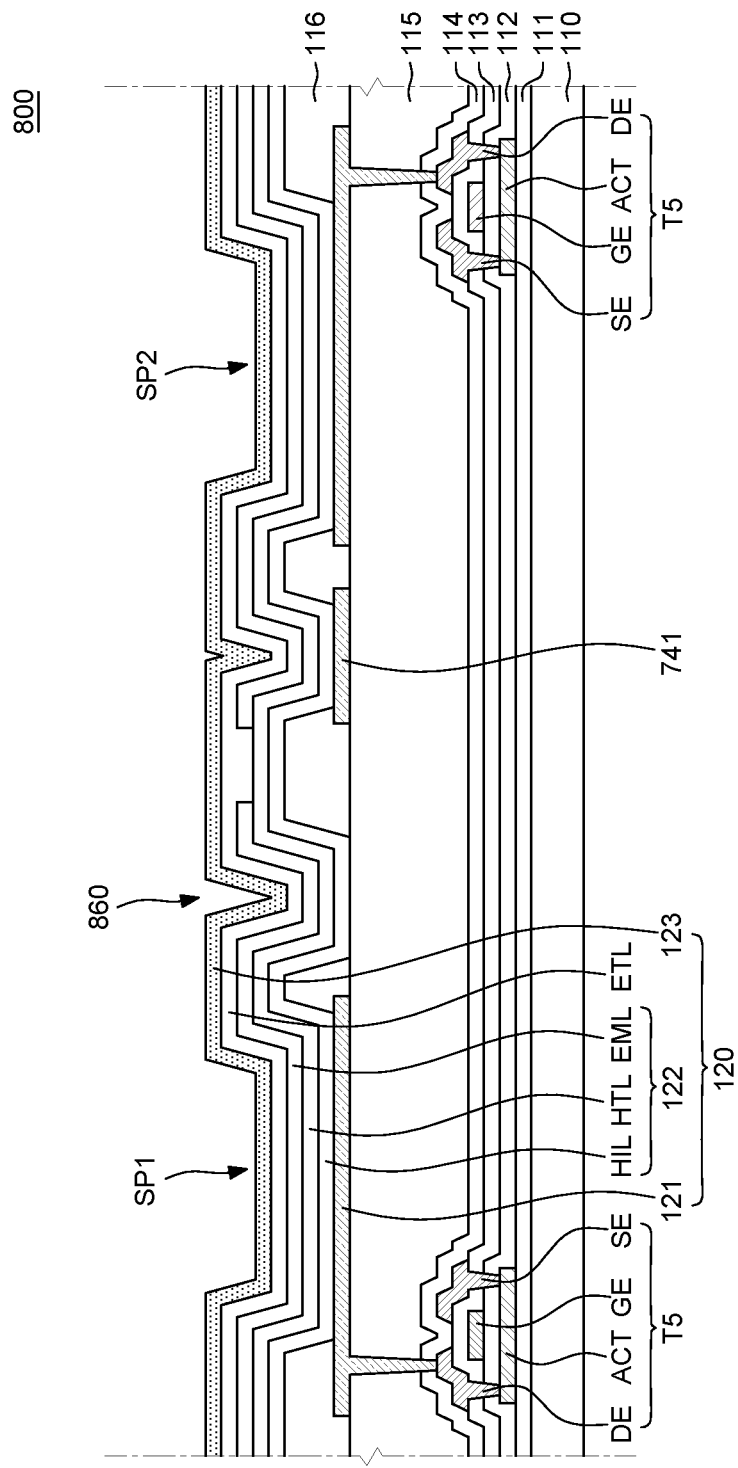
FIG. 8 is a cross-sectional view of a display apparatus according to still another exemplary embodiment of the present disclosure.

FIG. 8 is a cross-sectional view of a display apparatus according to still another exemplary embodiment of the present disclosure. The only difference of a display apparatus 800 of FIG. 8 from the display apparatus 700 of FIG. 7 is that a trench pattern 860 is further included, but the other configuration is substantially the same, so that a redundant description will be omitted.

Referring to FIG. 8, the trench pattern 860 is disposed in the bank 116. Specifically, the trench pattern 860 may be disposed between the first sub pixel SP1 and the conductive layer 740. The trench pattern 860 is disposed on the bank 116 between the first sub pixel SP1 and the second sub pixel SP2. However, it is not limited thereto and the trench pattern 860 may also be disposed between the first pixel SP1 and the third sub pixel SP6 and disposed between the second sub pixel SP2 and the third sub pixel SP3.

Referring to FIG. 8, the trench pattern 860 may have a V shape having a plurality of inclined surfaces extending from an upper surface of the bank 116. Common organic layers HIL, HTL, and ETL disposed on the bank 116 may be disposed on the trench pattern 860. Even though in FIG. 8, it is illustrated that the emission layer EML is disposed on the trench pattern 860, no emission layer EML is disposed on the trench pattern 860 or only a part of the emission layer EML may be disposed thereon, but is not limited thereto.

In the display apparatus 800 according to still another exemplary embodiment of the present disclosure, the trench pattern 860 is disposed on the bank 116 between the first sub pixel SP1 and the second sub pixel SP2 to minimize the leakage current through the common organic layers HIL, HTL, and ETL of the plurality of light emitting diodes 120. First, the organic layer 122 is disposed on the bank 116 in which the trench pattern 860 is formed so that the organic layer 122 is also disposed in the trench pattern 860. Since the organic layer 122 is deposited along the trench pattern 860 so that the common organic layers HIL, HTL, and ETL of the organic layer 122 which serves as a path of the leakage current are formed along the trench pattern 860 and the bank 116. Therefore, the lengths of the common organic layers HIL, HTL, and ETL are increased and the length of the path of the leakage current is increased. Therefore, the length of the organic layer 122 which serves as a path through which the leakage current flows is increased by the trench pattern 860 so that the resistance of the organic layer 122 may be increased. Therefore, the leakage current which flows to the light emitting diode 120 of the adjacent sub pixel SP may be reduced. Accordingly, in the display apparatus 800 according to still another exemplary embodiment of the present disclosure, the trench pattern 860 is disposed in the bank 116 between the first sub pixel SP1 and the second sub pixel SP2 to minimize the leakage current through the common organic layers HIL, HTL, and ETL of the plurality of light emitting diodes 120.

Figure 9:
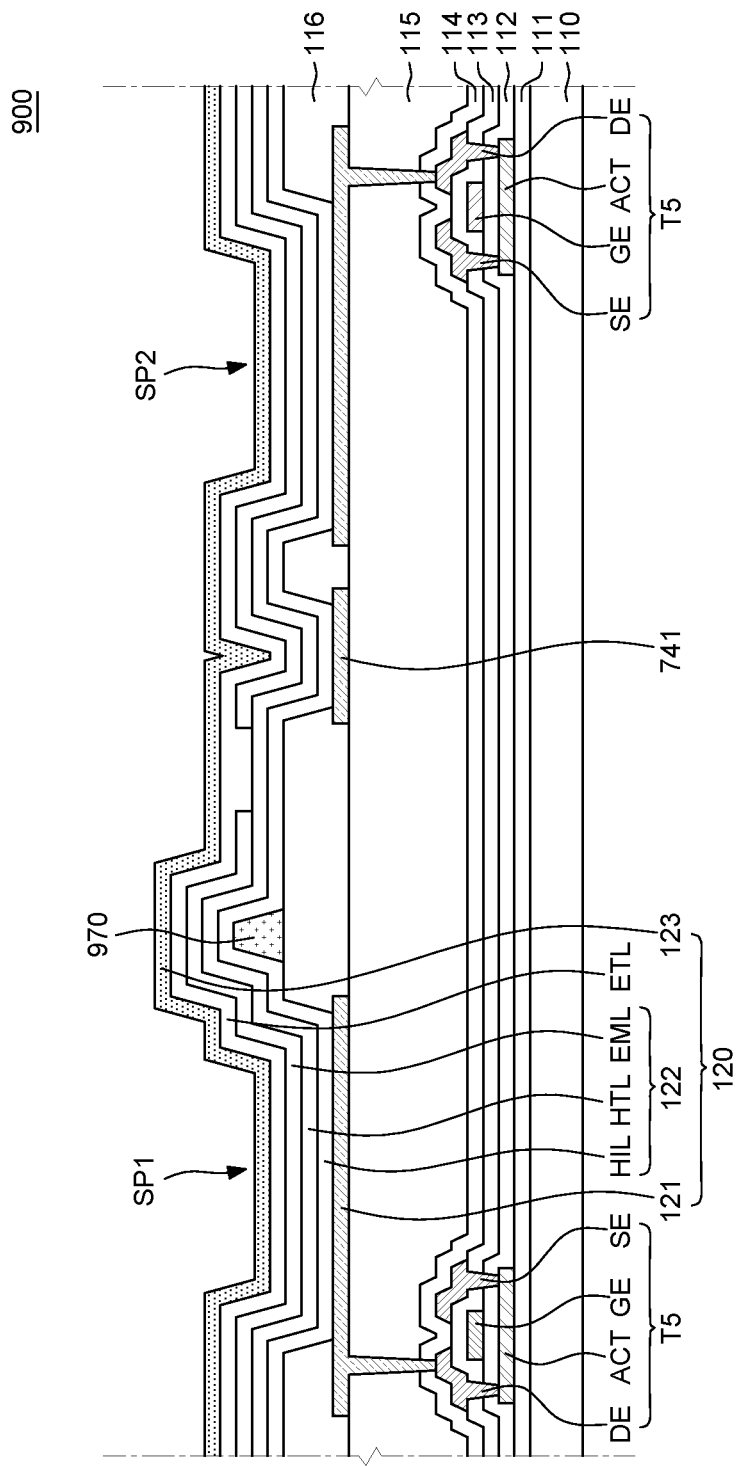
FIG. 9 is a cross-sectional view of a display apparatus according to still another exemplary embodiment of the present disclosure.

FIG. 9 is a cross-sectional view of a display apparatus according to still another exemplary embodiment of the present disclosure. The only difference of a display apparatus 900 of FIG. 9 from the display apparatus 700 of FIG. 7 is that a taper pattern 970 is further included, but the other configuration is substantially the same, so that a redundant description will be omitted.

Referring to FIG. 9, the taper pattern 970 is further disposed on the bank 116 between the first sub pixel SP1 and the second sub pixel SP2. The taper pattern 970 is disposed between the first sub pixel SP1 and the conductive layer 740 on the bank 116. However, it is not limited thereto and the taper pattern 970 may also be disposed between the third sub pixel SP3 and the conductive layer 740. Further, in FIG. 9, even though it is illustrated that the taper pattern 970 is disposed on the bank 116, it is not limited thereto and a reversed taper pattern may be disposed on the bank 116.

Referring to FIG. 9, common organic layers HIL, HTL, and ETL disposed on the bank 116 may be disposed on the taper pattern 970. Even though in FIG. 9, it is illustrated that the emission layer EML is disposed on the taper pattern 970, no emission layer EML is disposed on the taper pattern 970 or only a part of the emission layer EML may be disposed thereon, but is not limited thereto.

In the display apparatus 900 according to still another exemplary embodiment of the present disclosure, the taper pattern 970 is disposed in the bank 116 between the first sub pixel SP1 and the conductive layer 740 to minimize the leakage current through the common organic layers HIL, HTL, and ETL of the plurality of light emitting diodes 120. First, the organic layer 122 is disposed on the bank 116 in which the taper pattern 970 is formed so that the organic layer 122 is also disposed in the taper pattern 970. Since the organic layer 122 is deposited along the taper pattern 970 so that the common organic layers HIL, HTL, and ETL of the organic layer 122 which serves as a path of the leakage current are formed along the taper pattern 970 and the bank 116. Therefore, the lengths of the common organic layers HIL, HTL, and ETL may be increased and the length of the path of the leakage current may be increased. Therefore, the length of the organic layer 122 which serves as a path through which the leakage current flows is increased by the taper pattern 970 so that the resistance of the organic layer 122 may be increased. Therefore, the leakage current which flows to the light emitting diode 120 of the adjacent sub pixel SP may be reduced. Therefore, in the display apparatus 900 according to still another exemplary embodiment of the present disclosure, the taper pattern 970 is disposed in the bank 116 between the first sub pixel SP1 and the conductive layer 740 to minimize the leakage current through the common organic layers HIL, HTL, and ETL of the plurality of light emitting diodes 120.

Figure 10:
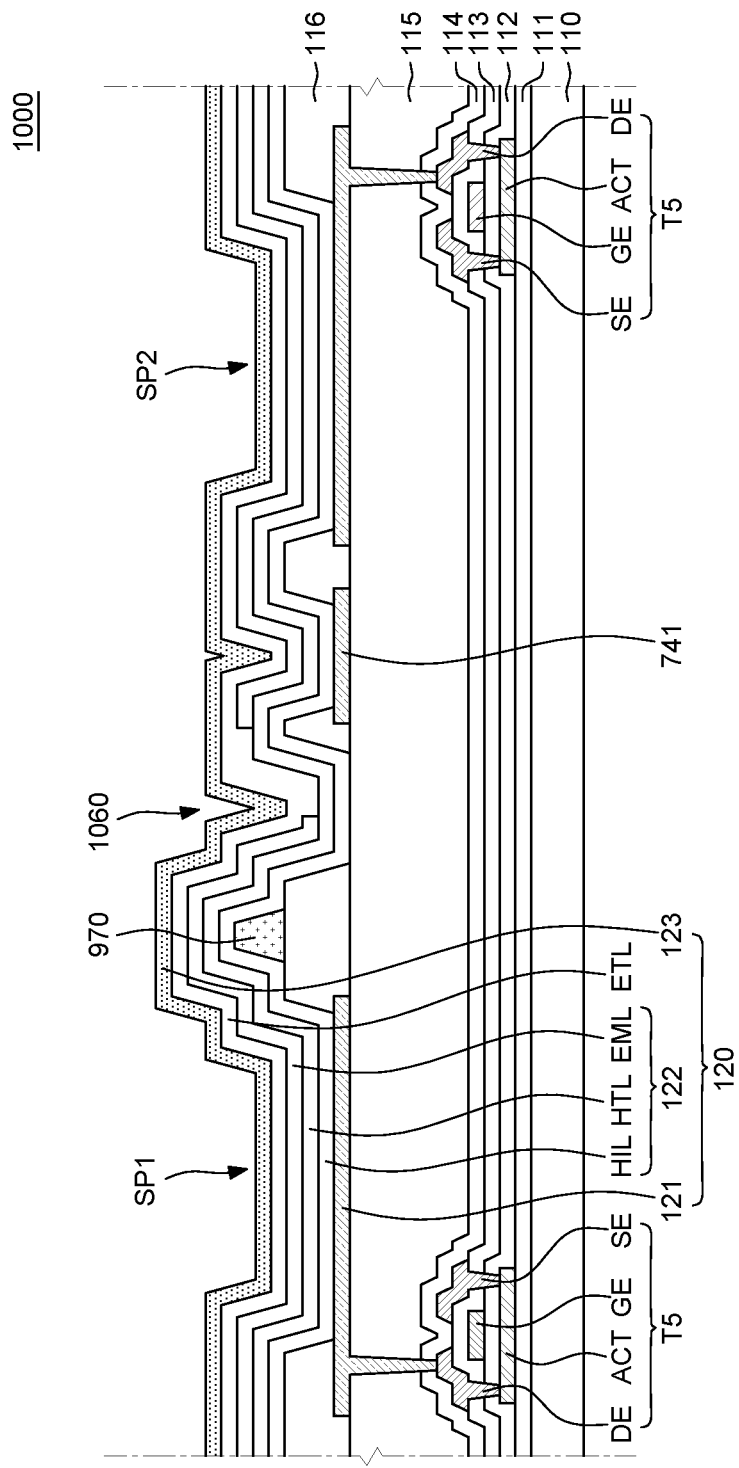
FIG. 10 is a cross-sectional view of a display apparatus according to still another exemplary embodiment of the present disclosure.

FIG. 10 is a cross-sectional view of a display apparatus according to still another exemplary embodiment of the present disclosure. The only difference of a display apparatus 1000 of FIG. 10 from the display apparatus 900 of FIG. 9 is that a trench pattern 1060 is further included, but the other configuration is substantially the same, so that a redundant description will be omitted.

Referring to FIG. 10, the trench pattern 1060 is further disposed in the bank 116. Specifically, the trench pattern 1060 may be disposed between the first sub pixel SP1 and the conductive layer 740. The trench pattern 1060 is disposed on the bank 116 between the first sub pixel SP1 and the second sub pixel SP2. However, it is not limited thereto and the trench pattern 1060 may also be disposed between the first pixel SP1 and the third sub pixel SP3 and disposed between the second sub pixel SP2 and the third sub pixel SP3.

Referring to FIG. 10, the trench pattern 1060 may have a V shape having a plurality of inclined surfaces extending from an upper surface of the bank 116. Common organic layers HIL, HTL, and ETL disposed on the bank 116 may be disposed on the trench pattern 1060.

Referring to FIG. 10, the taper pattern 970 is further disposed on the bank 116 between the first sub pixel SP1 and the second sub pixel SP2. The taper pattern 970 is disposed between the first sub pixel SP1 and the trench pattern 1060 on the bank 116. However, it is not limited thereto and the taper pattern 970 may also be disposed between the third sub pixel SP3 and the trench pattern 1060. Further, in FIG. 10, even though it is illustrated that the taper pattern 970 is disposed on the bank 116, it is not limited thereto and a reversed taper pattern may be disposed on the bank 116. Referring to FIG. 10, common organic layers HIL, HTL, and ETL disposed on the bank 116 may be disposed on the taper pattern 970.

In the display apparatus 1000 according to still another exemplary embodiment of the present disclosure, the trench pattern 1060 and the taper pattern 970 are disposed in the bank 116 between the first sub pixel SP1 and the second sub pixel SP2 to minimize the leakage current through the common organic layers HIL, HTL, and ETL of the plurality of light emitting diodes 120. Specifically, since the organic layer 122 is disposed on the bank 116 on which the trench pattern 1060 and the taper pattern 970 are formed, the common organic layers HIL, HTL, and ETL of the organic layer 122 which serve as a path of the leakage current are formed along the trench pattern 1060, the taper pattern 970, and the bank 116. Therefore, the lengths of the common organic layers HIL, HTL, and ETL may be increased and the length of the path of the leakage current may be increased. Therefore, the length of the organic layer 122 which serves as a path through which the leakage current flows is increased so that the resistance of the organic layer 122 may be increased. As a result, the leakage current which flows to the light emitting diode 120 of the adjacent sub pixel SP may be reduced. Accordingly, in the display apparatus 1000 according to still another exemplary embodiment of the present disclosure, the trench pattern 1060 and the taper pattern 970 are disposed between the first sub pixel SP1 and the second sub pixel SP2 to minimize the leakage current through the common organic layers HIL, HTL, and ETL of the plurality of light emitting diodes 120.

The exemplary embodiments of the present disclosure can also be described as follows:

According to an aspect of the present disclosure, a display apparatus includes a substrate in which a plurality of sub pixels are defined; a plurality of light emitting diodes which are disposed in the plurality of sub pixels, share a common organic layer and a cathode, and have an emission layer and an anode which are separated, respectively; a conductive layer disposed between the plurality of sub pixels; and a bank which is disposed below the cathode between the plurality of light emitting diodes and exposes the anode and the conductive layer The plurality of sub pixels include a first sub pixel and a second sub pixel having a turn-on voltage lower than that of the first sub pixel, and the conductive layer is disposed to be closer to the second sub pixel between the first sub pixel and the second sub pixel.

The display apparatus may further comprise a planarization layer disposed between the substrate and the plurality of light emitting diodes, wherein the anode and the conductive layer are disposed on the planarization layer.

The emission layer disposed in the second sub pixel may be disposed on the conductive layer.

A width of the emission layer disposed on the conductive layer may be larger than a width of the conductive layer exposed by the bank.

The first sub pixel may be a blue sub pixel, and the second sub pixel may be a red sub pixel or a green sub pixel.

The plurality of sub pixels may further include a third sub pixel having a turn-on voltage which is lower than that of the first sub pixel and is higher than that of the second sub pixel. The conductive layer may include a first conductive layer which is disposed to be closer to the second sub pixel between the first sub pixel and the second sub pixel, and a second conductive layer which is disposed to be closer to the third sub pixel between the first sub pixel and the third sub pixel.

The conductive layer may further include a third conductive layer which is disposed to be closer to the second sub pixel between the second sub pixel and the third sub pixel.

The first sub pixel may be a blue sub pixel, the second sub pixel may be a red sub pixel, and the third sub pixel may be a green sub pixel.

The display apparatus may further comprise a trench pattern which is disposed on the bank and is disposed between the first sub pixel and the conductive layer.

The display apparatus may further comprise a taper pattern or a reversed taper pattern disposed on the bank between the first sub pixel and the trench pattern or between the trench pattern and the conductive layer.

The display apparatus may further comprise a taper pattern or a reversed taper pattern which is disposed between the first sub pixel and the conductive layer on the bank.

The conductive layer may be electrically floating.

According to another aspect of the present disclosure, a display apparatus may comprise a substrate, a plurality of sub pixels which are disposed on the substrate and include a first sub pixel and a second sub pixel having a turn-on voltage lower than that of the first sub pixel, a plurality of light emitting diodes which include an anode, an emission layer, a common organic layer, and a cathode and are disposed in each of the first sub pixel and the second sub pixel, and a conductive layer which is disposed to be closer to the second sub pixel between the first sub pixel. The plurality of light emitting diodes share the common organic layer and the cathode.

The anode and the conductive layer may be disposed on the same layer and are formed of the same material.

The emission layer disposed in the second sub pixel may extend onto the conductive layer so that the conductive layer, the emission layer, the common organic layer, and the cathode form an auxiliary light emitting diode.

An emission area of the auxiliary light emitting diode may be smaller than an emission area of each of the plurality of light emitting diodes.

The display apparatus may further comprise a third sub pixel having a turn-on voltage which is lower than a turn-on voltage of the first sub pixel and is higher than a turn-on voltage of the second sub pixel. The auxiliary light emitting diode may include a first auxiliary light emitting diode which emits light having the same color as that of the second sub pixel between the first sub pixel and the second sub pixel, and a second auxiliary light emitting diode which emits light having the same color as that of the third sub pixel between the first sub pixel and the third sub pixel.

The auxiliary light emitting diode may further include a third auxiliary light emitting diode which emits light having the same color as that of the second sub pixel between the second sub pixel and the third sub pixel.

The first sub pixel may include a blue emission layer, and the second sub pixel may include a red emission layer or a green emission layer.

The display apparatus may further comprise a third sub pixel having a turn-on voltage which is lower than a turn-on voltage of the first sub pixel and is higher than a turn-on voltage of the second sub pixel. The conductive layer may include a first conductive layer which is disposed to be closer to the second sub pixel between the first sub pixel and the second sub pixel, and a second conductive layer which is disposed to be closer to the third sub pixel between the first sub pixel and the third sub pixel.

The conductive layer may further include a third conductive layer which is disposed to be closer to the second sub pixel between the second sub pixel and the third sub pixel.

The first sub pixel may include a blue emission layer, the second sub pixel may include a red emission layer, and the third sub pixel may include a green emission layer.

The display apparatus may further comprise a bank which is disposed to define a position of the plurality of sub pixels on the substrate and exposes the conductive layer, and a trench pattern which is disposed on the bank between the first sub pixel and the second sub pixel.

The display apparatus may further comprise a taper pattern or a reversed taper pattern disposed on the bank between the first sub pixel and the trench pattern.

The display apparatus may further comprise a bank which is disposed to define a position of the plurality of sub pixels on the substrate and exposes the conductive layer, and a taper pattern or reversed taper pattern which is disposed on the bank between the first sub pixel and the second sub pixel.

The conductive layer may be electrically floating.

What is claimed is:

1. A display apparatus, comprising:
   a substrate in which a plurality of sub pixels are defined;
   a plurality of light emitting diodes which are disposed in the plurality of sub pixels, share a common organic layer and a cathode, and have an emission layer and an anode which are separated, respectively;
   a conductive layer disposed between the plurality of sub pixels; and
   a bank which is disposed below the cathode between the plurality of light emitting diodes and exposes the anode and the conductive layer,
   wherein the plurality of sub pixels include a first sub pixel and a second sub pixel having a turn-on voltage lower than that of the first sub pixel, and the conductive layer is disposed to be closer to the second sub pixel between the first sub pixel and the second sub pixel.

2. The display apparatus according to claim 1, further comprising:
   a planarization layer disposed between the substrate and the plurality of light emitting diodes,
   wherein the anode and the conductive layer are disposed on the planarization layer.

3. The display apparatus according to claim 1, wherein the emission layer in the second sub pixel is disposed on the conductive layer.

4. The display apparatus according to claim 3, wherein a width of the emission layer disposed on the conductive layer is larger than a width of the conductive layer exposed by the bank.

5. The display apparatus according to claim 1, wherein the first sub pixel is a blue sub pixel, and the second sub pixel is a red sub pixel or a green sub pixel.

6. The display apparatus according to claim 1, wherein the plurality of sub pixels further include a third sub pixel having a turn-on voltage which is lower than that of the first sub pixel and is higher than that of the second sub pixel,
   the conductive layer includes a first conductive layer which is disposed to be closer to the second sub pixel between the first sub pixel and the second sub pixel, and a second conductive layer which is disposed to be closer to the third sub pixel between the first sub pixel and the third sub pixel.

7. The display apparatus according to claim 6, wherein the conductive layer further includes a third conductive layer which is disposed to be closer to the second sub pixel between the second sub pixel and the third sub pixel.

8. The display apparatus according to claim 6, wherein the first sub pixel is a blue sub pixel, the second sub pixel is a red sub pixel, and the third sub pixel is a green sub pixel.

9. The display apparatus according to claim 1, further comprising:
   a trench pattern which is disposed on the bank and is disposed between the first sub pixel and the conductive layer.

10. The display apparatus according to claim 9, further comprising:
a taper pattern or a reversed taper pattern disposed on the bank between the first sub pixel and the trench pattern or between the trench pattern and the conductive layer.

11. The display apparatus according to claim 1, further comprising:
a taper pattern or a reversed taper pattern which is disposed between the first sub pixel and the conductive layer on the bank.

12. The display apparatus according to claim 1, wherein the conductive layer is electrically floating.

13. A display apparatus, comprising:
a substrate;
a plurality of sub pixels which are disposed on the substrate and include a first sub pixel and a second sub pixel having a turn-on voltage lower than that of the first sub pixel;
a plurality of light emitting diodes which include an anode, an emission layer, a common organic layer, and a cathode and are disposed in each of the first sub pixel and the second sub pixel; and
a conductive layer which is disposed to be closer to the second sub pixel between the first sub pixel and the second sub pixel,
wherein the plurality of light emitting diodes share the common organic layer and the cathode.

14. The display apparatus according to claim 13, wherein the anode and the conductive layer are disposed on the same layer and are formed of the same material.

15. The display apparatus according to claim 13, wherein the emission layer disposed in the second sub pixel extends onto the conductive layer so that the conductive layer, the emission layer, the common organic layer, and the cathode form an auxiliary light emitting diode.

16. The display apparatus according to claim 15, wherein an emission area of the auxiliary light emitting diode is smaller than an emission area of each of the plurality of light emitting diodes.

17. The display apparatus according to claim 15, further comprising:
a third sub pixel having a turn-on voltage which is lower than a turn-on voltage of the first sub pixel and is higher than a turn-on voltage of the second sub pixel,
wherein the auxiliary light emitting diode includes a first auxiliary light emitting diode which emits light having the same color as that of the second sub pixel between the first sub pixel and the second sub pixel, and a second auxiliary light emitting diode which emits light having the same color as that of the third sub pixel between the first sub pixel and the third sub pixel.

18. The display apparatus according to claim 17, wherein the auxiliary light emitting diode further includes a third auxiliary light emitting diode which emits light having the same color as that of the second sub pixel between the second sub pixel and the third sub pixel.

19. The display apparatus according to claim 13, wherein the first sub pixel includes a blue emission layer, and the second sub pixel includes a red emission layer or a green emission layer.

20. The display apparatus according to claim 13, further comprising:
a third sub pixel having a turn-on voltage which is lower than a turn-on voltage of the first sub pixel and is higher than a turn-on voltage of the second sub pixel,
wherein the conductive layer includes a first conductive layer which is disposed to be closer to the second sub pixel between the first sub pixel and the second sub pixel, and a second conductive layer which is disposed to be closer to the third sub pixel between the first sub pixel and the third sub pixel.

21. The display apparatus according to claim 20, wherein the conductive layer further includes a third conductive layer which is disposed to be closer to the second sub pixel between the second sub pixel and the third sub pixel.

22. The display apparatus according to claim 20, wherein the first sub pixel includes a blue emission layer, the second sub pixel includes a red emission layer, and the third sub pixel includes a green emission layer.

23. The display apparatus according to claim 13, further comprising:
a bank which is disposed to define a position of the plurality of sub pixels on the substrate and exposes the conductive layer, and
a trench pattern which is disposed on the bank between the first sub pixel and the second sub pixel.

24. The display apparatus according to claim 23, further comprising:
a taper pattern or a reversed taper pattern disposed on the bank between the first sub pixel and the trench pattern.

25. The display apparatus according to claim 13, further comprising:
a bank which is disposed to define a position of the plurality of sub pixels on the substrate and exposes the conductive layer, and
a taper pattern or reversed taper pattern which is disposed on the bank between the first sub pixel and the second sub pixel.

26. The display apparatus according to claim 13, wherein the conductive layer is electrically floating.

* * * * *